US008878572B2

(12) United States Patent
Akiyama et al.

(10) Patent No.: US 8,878,572 B2
(45) Date of Patent: Nov. 4, 2014

(54) DRIVE CONTROL APPARATUS

(71) Applicant: DENSO CORPORATION, Kariya (JP)

(72) Inventors: Hironori Akiyama, Kariya (JP); Noriyuki Fukui, Hamamatsu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/182,744

(22) Filed: Feb. 18, 2014

(65) Prior Publication Data
US 2014/0253182 A1 Sep. 11, 2014

(30) Foreign Application Priority Data

Mar. 5, 2013 (JP) .................................. 2013-042882

(51) Int. Cl.
H03B 1/00 (2006.01)
H03K 3/00 (2006.01)
H03K 5/153 (2006.01)

(52) U.S. Cl.
CPC .................................... H03K 5/153 (2013.01)
USPC ........... 327/108; 327/109; 327/110; 327/111; 327/112

(58) Field of Classification Search
USPC ................................................ 327/108–112
See application file for complete search history.

(56) References Cited

U.S. PATENT DOCUMENTS

| 8,072,241 | B2 * | 12/2011 | Kouno ............................ 326/61 |
| 8,134,400 | B2 * | 3/2012 | Yamamoto .................... 327/333 |
| 8,451,023 | B2 * | 5/2013 | Kouno ............................ 326/61 |
| 8,735,989 | B2 * | 5/2014 | Matsushita .................... 257/370 |
| 2004/0000884 | A1 * | 1/2004 | Inao et al. ...................... 318/254 |
| 2009/0057832 | A1 * | 3/2009 | Kouno ............................ 257/577 |
| 2010/0090248 | A1 * | 4/2010 | Kouno ............................ 257/140 |
| 2010/0156506 | A1 * | 6/2010 | Tsuzuki et al. ................ 327/478 |
| 2010/0187567 | A1 | 7/2010 | Tanabe et al. |
| 2010/0283514 | A1 | 11/2010 | Soeno et al. |
| 2011/0074485 | A1 * | 3/2011 | Yamamoto .................... 327/333 |
| 2011/0285427 | A1 | 11/2011 | Koyama et al. |

FOREIGN PATENT DOCUMENTS

JP 2008-282999 A 11/2008

* cited by examiner

Primary Examiner — Adam Houston
(74) Attorney, Agent, or Firm — Posz Law Group, PLC

(57) ABSTRACT

A drive control apparatus for a semiconductor device having a diode and a transistor includes: a current detection device of a current flowing through the diode; and a control device, which applies a gate drive voltage to the semiconductor device when an on-instruction signal is input. The control device compares the current detection signal with a current threshold value during a first period, in which the on-instruction signal is input, after a second period has elapsed from gate drive voltage application time, or gate drive voltage shut-off time. A transient variation is generated on the current detection signal in the second period. The control device shuts off the gate drive voltage when the current detection signal is equal to or larger than the current threshold value. The control device applies the gate drive voltage when the current detection signal is smaller than the current threshold value.

6 Claims, 10 Drawing Sheets

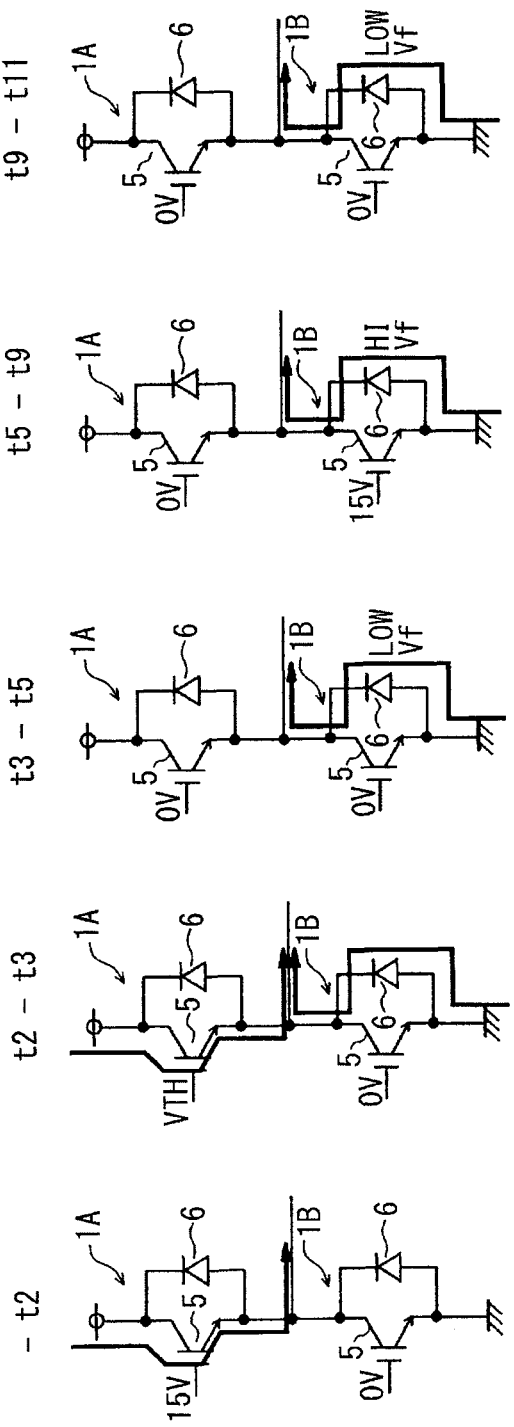

DRIVE CONTROL APPARATUS

CROSS REFERENCE TO RELATED APPLICATION

This application is based on Japanese Patent Application No. 2013-42882 filed on Mar. 5, 2013, the disclosure of which is incorporated herein by reference.

TECHNICAL FIELD

The present disclosure relates to a drive control apparatus for controlling a semiconductor device having an insulated gate transistor structure and a diode structure, which are disposed in a same semiconductor substrate.

BACKGROUND

A semiconductor device as a RC-IGBT having an insulated gate type bipolar transistor device (i.e., an IGBT device) and a diode device, which are formed in a same semiconductor substrate, is well known. In the semiconductor device, an energization electrode (i.e., a collector and an emitter) of the IGBT device and an energization electrode (i.e., a cathode and an anode) of the diode device are provided by a common electrode. In the RC-IGBT, when a gate drive voltage is applied under a condition that current flows through the diode device, a channel is formed, so that a hole injection is restricted. Thus, the RC-IGBT has a characteristic that conduction loss increases.

Thus, while an on-state instruction signal is applied to the RC-IGBT, current flowing through a sense element in the RC-IGBT is compared with a threshold value, so that the RC-IGBT determines whether current flows through the diode device. When the current flows through the diode device, the gate drive voltage is shut off, and when the current does not flow through the diode device, the gate drive voltage is applied. These drive control methods are disclosed in JP-A-2010-118642 (corresponding to US 2010-0090248-A1).

It is necessary to perform the shut-off control of the gate drive voltage only when the current flows through the diode device. For example, in an inverter apparatus, when the gate drive voltage is shut off under a condition that the current flows through the IGBT device according to the on-state instruction signal, i.e., under a condition that the current does not flow through the diode device, a current waveform is deformed. Accordingly, high accuracy for determining a polarity whether the current flows through the diode device.

However, a current detection part such as a sense resistor includes a parasitic inductance, which is not avoidable. Accordingly, when an element current flowing through the RC-IGBT changes, a vibration is generated in a current detection signal attributed to the parasitic inductance. As a result, especially when the element current is small, a vibration component of the current detection signal falls below a threshold value. Thus, the apparatus may fail to detect a polarity. Further, the vibration may be overlapped on the current detection signal attributed to other reasons.

In view of the above failure, it is considered that the threshold value used in the polarity detection may be set higher so as to avoid the above failure. However, when the threshold value is high, a dead zone, in which the gate drive voltage is not able to shut off although the current flows through the diode device, expands. Accordingly, especially when the current is small, the conduction loss is not sufficiently reduced.

SUMMARY

It is an object of the present disclosure to provide a drive control apparatus for controlling a semiconductor device having a transistor structure and a diode structure, which are arranged in a same semiconductor substrate. The apparatus determines with high accuracy whether a current flows through the diode structure, and, based on a determination result, the apparatus reduces a conduction loss of the semiconductor device.

According to an aspect of the present disclosure, a drive control apparatus for a semiconductor device having an insulated gate type transistor structure and a diode structure, which are disposed in a same semiconductor substrate, wherein the semiconductor device includes an energization electrode of the transistor structure and an energization electrode of the diode structure, which are provided by a common electrode, and wherein a gate drive voltage is applied to the insulated gate type transistor structure, the drive control apparatus includes: a current detection device for outputting at least a current detection signal, which corresponds to a current flowing through the diode structure; and a control device. The control device applies the gate drive voltage to the semiconductor device when an on-instruction signal is input in the control device. The control device compares the current detection signal with a current threshold value preliminary set in a forward direction of the diode structure during a first period, in which the on-instruction signal is input in the control device, after a second period has elapsed from first time, at which the control device applies the gate drive voltage, or second time, at which the control device shuts off the gate drive voltage. A transient variation caused by a change of a gate drive state is generated on the current detection signal in the second period. The control device shuts off the gate drive voltage when the current detection signal is equal to or larger than the current threshold value. The control device applies the gate drive voltage when the current detection signal is smaller than the current threshold value.

The above apparatus determines accurately without increasing the current threshold value whether the current flows through the diode structure. Thus, the gate drive voltage is surely shut off in the period, in which the current flows through the diode structure, other than the period, in which the transient variation may be overlapped on the current detection signal. Accordingly, a conduction loss of the diode structure is reduced. Further, the apparatus flows the current through the transistor structure according to the on-instruction signal.

BRIEF DESCRIPTION OF THE DRAWINGS

The above and other objects, features and advantages of the present disclosure will become more apparent from the following detailed description made with reference to the accompanying drawings. In the drawings:

FIGS. 9A to 9E are diagram showing a current path corresponding to FIG. 6;

DETAILED DESCRIPTION

Figure 1:
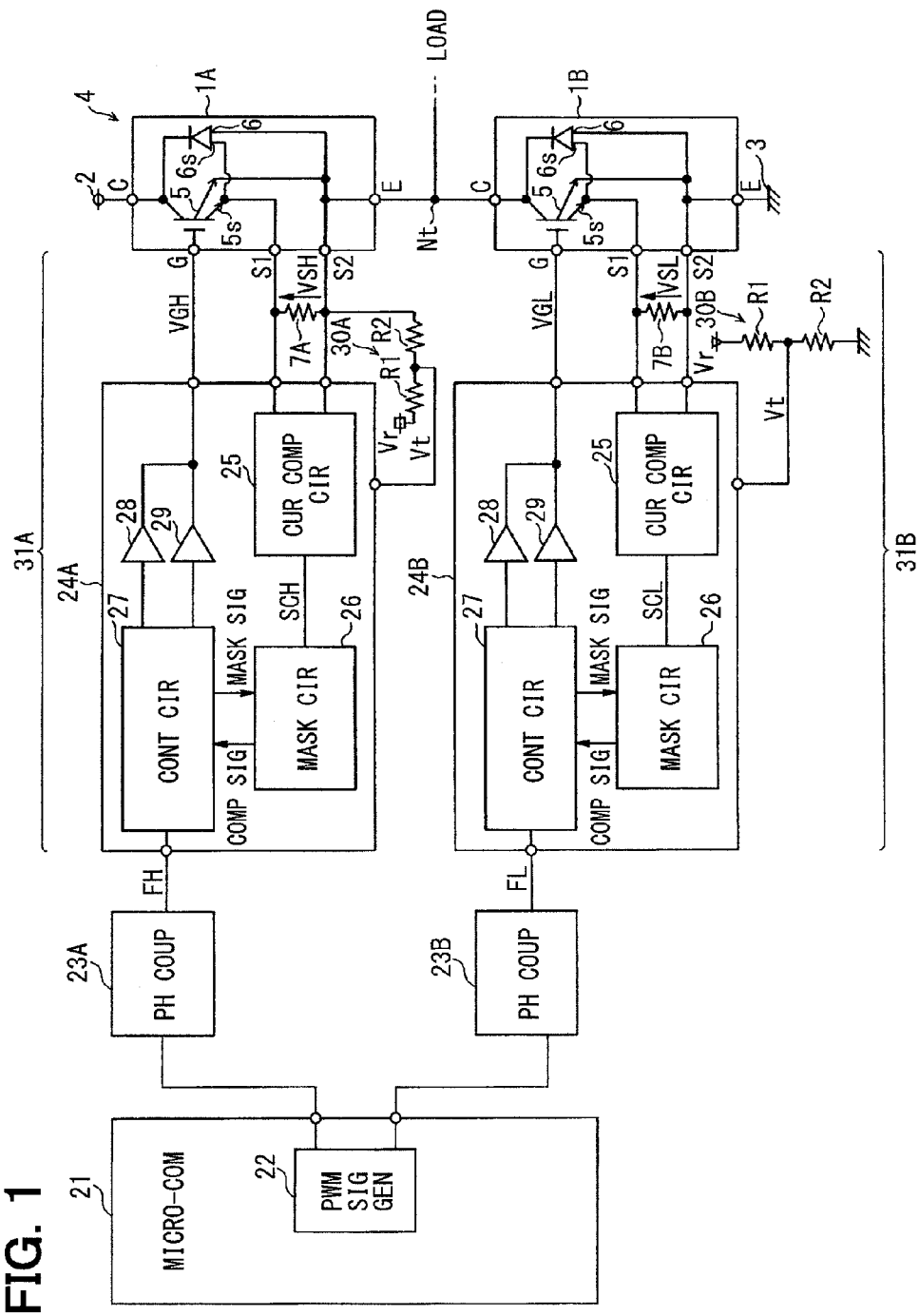
FIG. 1 is a diagram showing a drive control system according to an example embodiment.

An example embodiment of the present disclosure will be explained with reference to the drawings as follows. A drive control system shown in FIG. 1 is suitably used for an electric power converter apparatus such as an inverter apparatus for driving an inductive load such as a motor, and a chopper apparatus having an inductor for increasing and decreasing a direct current voltage. Semiconductor devices 1A, 1B as a switching device are arranged in series via an output terminal Nt between a direct current electric power line 2 on a high potential side and a direct current electric power line 3 on a low potential side so that the devices provide a half bridge circuit 4.

The semiconductor devices 1A, 1B having the same structure are reverse conduction type IGBT RC-IGBT) having an insulated gate type transistor 5 and a diode 6, which are arranged in a same semiconductor substrate. An energization electrode of the transistor 5 (i.e., a collector and an emitter) and an energization electrode of the diode 6 (i.e., a cathode and an anode) are a common electrode.

Figure 2:
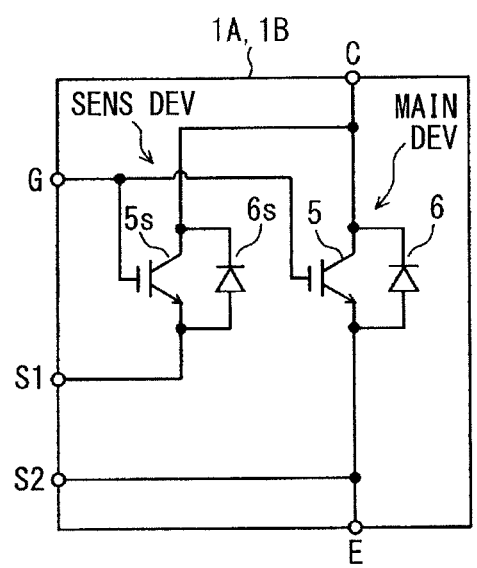
FIG. 2 is a circuit diagram showing a main device and a sense device.

In addition to the above main devices, a sense device is formed in the semiconductor substrate, as shown in FIG. 2. The sense device includes a transistor 5s and a diode 6s for flowing a very small current, which is in proportion to the current flowing through the main device. In FIG. 1, the main device and the sense device are shown simply. The sense resistor 7A 7b is arranged between sense terminals S1, S2 of each semiconductor device 1A, 1B. The sense resistor 7A<7B provides a current detection device.

Figure 3:
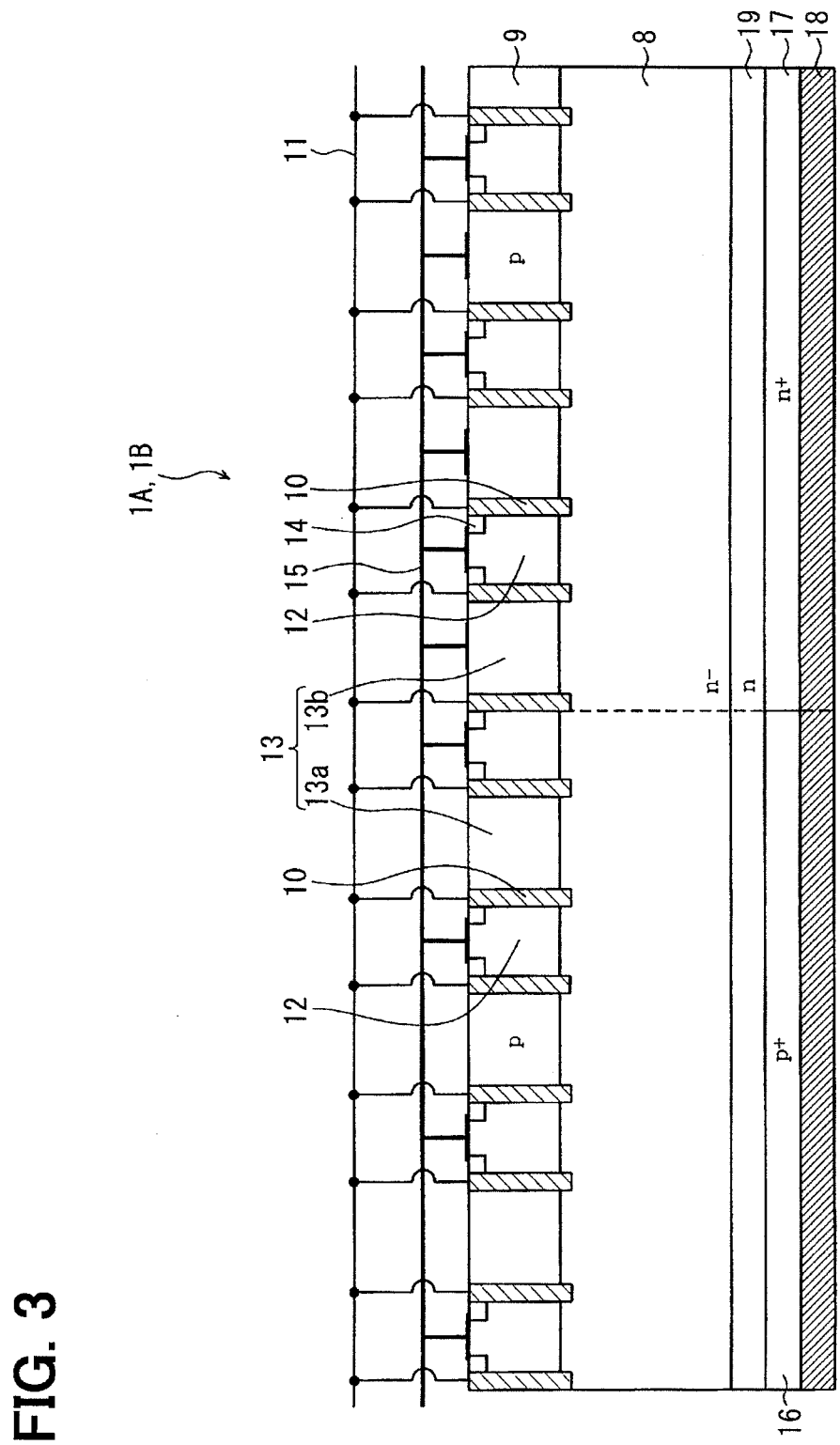
FIG. 3 is a diagram showing a vertical cross sectional view of a semiconductor device.

FIG. 3 shows a vertical structure RC-IGBT as an example of the semiconductor device 1A, 1B. The RC-IGBT according to the present embodiment includes the transistor structure and the diode structure, which are arranged in the same semiconductor substrate 8. The semiconductor substrate 8 is made of a N– conductive type silicon substrate. Although not shown, a guard ring is formed in a periphery portion of a device-forming region of the substrate 8. The guard ring surrounds the device-forming region.

A P conductive type base layer 9 is formed in an upper surface portion of the substrate 8. Multiple trenches are formed in the base layer 9 such that each trench penetrates the base layer 9 and reaches the substrate 8. A poly silicon material is embedded in each trench, so that a trench structure gate electrode 10 is formed. A gate drive voltage is applied to each gate electrode 10 via a common gate wiring 11. The gate electrodes 10 provide a stripe pattern such that the gate electrodes 10 are arranged at equal intervals along one direction, which is in parallel to the surface of the base layer 9. Thus, the base layer 9 is divided into multiple first regions 12 and multiple second regions 13, which are electrically separated from each other and the regions 12, 13 are aligned along the one direction. Thus, the first regions 12 and the second regions 13 are alternately arranged. The width of the second region 13 is wider than the width of the first region 12.

An emitter region 14 having a N+ conductive type is formed in a surface portion of the first region 12 such that the emitter region 14 is adjacent to (i.e., contacts) the gate electrode 10. The emitter electrode 15 is formed on the first region 12. The emitter electrode 15 is connected to the base layer 9 of the first region 12 and the emitter region 14. The first region 12 functions as a channel region of the transistor 5. Further, the first region 12 functions as an anode region of the diode 6. Thus, the emitter electrode 15 in the first region 12 provides the emitter electrode of the transistor 5 and the anode electrode of the diode 6.

The second region 13a disposed over the collector region 16 is not electrically connected to any electrode. The second region 13b disposed over the cathode region 17 is connected to the emitter electrode 15. Thus, only the second region 13b in the second region 13 over the cathode region 17 functions as the anode region of the diode 6. Thus, the emitter electrode 15 in the second region 13b provides the anode electrode of the diode 6.

A P+ conductive type collector region 16 is formed in a lower surface portion of the substrate 8. The collector region 16 corresponds to a region, in which the second region 13a is formed, shown as a left side of a broken line in FIG. 3. A cathode region 17 having the N+ conductive type is formed in a lower surface portion of the substrate 8. The cathode region 17 corresponds to a region, in which the second region 13b is formed, shown as a right side of the broken line in FIG. 3. The collector region 16 and the cathode region 17 are connected to the collector electrode 18. Thus, the cathode electrode of the diode 6 is in common with the collector electrode 18 of the transistor 5. A field stop layer 19 having the N conductive type is formed between the substrate 8 and the collector region 16 or the cathode region 17.

In the drive control system shown in FIG. 1, the micro computer 21 includes a PWM signal generator 22 for generating PWM signals FH, FL of the half bridge circuit 4 on a high side and a low side. Each PWM signals FH, FL has a dead time with a predetermined time interval, in which the signals FH, FL are in a low level (i.e., a L level or an off instruction level). Each PWM signal FH, FL is input into the drive IC 24A<24B via the photo coupler 23A, 23B. The on instruction signal means the PWM signal FH, FL having the high level (i.e., a H level or an on instruction level).

Each of the drive ICs 24A, 24B having the same construction includes a current comparison circuit 25, a mask circuit 26, a control circuit 27 and a drive circuit 28, 29. An external threshold setting circuit 30A, 30B is attached to each of the drive ICs 24A, 24B. A reference voltage Vr is divided by a resistor R1, R2 in the threshold setting circuit 30A, 30B so that a threshold voltage Vt is generated. The drive IC 24A and the sense resistor 7A provide a drive control apparatus 31A. The drive IC 24B and the sense resistor 7b provide another drive control apparatus 31B.

The current comparison circuit 25 of the drive IC 24A compares the sense voltage VSH generated at the resistor 7A and the threshold voltage Vt generated at the threshold setting circuit 30A. Then, the circuit 25 outputs a comparison signal SCH as a comparison result. Similarly, the current comparison circuit 25 of the drive IC 24B compares the sense voltage VSL generated at the sense resistor 7B and the threshold voltage Vt generated at the threshold setting circuit 30B. Then, the circuit 25 outputs a comparison signal SCL as a comparison result. The sense voltage VSH, VSL corresponds to the current detection signal. The threshold voltage Vt corresponds to the current threshold value.

When the PWM signal FH is input into the control circuit 27 of the drive IC 24A, the circuit 27 applies and shuts off the gate drive voltage VGH. Further, the control circuit 27 executes a control for shutting off the gate drive voltage VGH when the current flows through the diode 6 of the semiconductor device 1A while the PWM signal FH is in the high level. The control of the circuit 27 provides to reduce the forward voltage Vf of the diode 6, and therefore, the control is defined as a Vf control.

In order to execute the Vf control effectively, it is necessary to determine with high accuracy whether the current flows through the diode 6 while the PWM signal FH is in the high level. Thus, the control circuit 27 inputs the mask signal to the mask circuit 26 at a predetermined timing. The mask circuit 26 transmits the comparison signal SCH to the control circuit 27 during a non-mask period, in which the mask signal is in the low level. During the mask-period, in which the mask signal is in the high level, the mask circuit 26 executes the mask process for processing the comparison signal SCH, and then, transmits the processed comparison signal to the control circuit 27. In the mask process, the circuit 26 maintains the input comparison signal SCH to be a value just before the mask period starts.

The drive circuits 28, 29 have different gate drive performance for charging and discharging the gate capacity. The drive circuit 28 has a normal gate drive performance. Specifically, the drive circuit 28 drives the gate using a constant current circuit in case of turning on in order to restrict a voltage surge caused by a rapid current change (dI/dt) of an element current. The drive circuit 28 drives the gate using a driving circuit having a high on-state resistance in case of turning off in order to delay the switching speed. On the other hand, the drive circuit 29 has the gate drive performance, which is higher than the drive circuit 28. Specifically, the drive circuit 29 drives the gate using the constant voltage circuit in case of turning on. The drive circuit 29 drives the gate using the driving circuit having the high on-state resistance and the driving circuit having the low on-state resistance, which are in parallel to each other, in case of turning off in order to increase the switching speed.

When the control circuit 27 applies the gate drive voltage VGH at the rising state of the PWM signal FH, or when the control circuit 27 shuts off the gate drive voltage VGH at the falling state of the PWM signal FH, the control circuit 27 utilizes the drive circuit 28 having the normal gate drive performance. On the other hand, when the control circuit 27 applies and shuts off the gate drive voltage VGH in the Vf control state, the circuit 27 utilizes the drive circuit 29 having the high gate drive performance. The gate drive voltage VGH provides to transfer the transistor 5 to be an on state. The mask circuit 26, the control circuit 27, and the drive circuits 28, 29 of the drive IC 24B function similarly.

Figure 4:
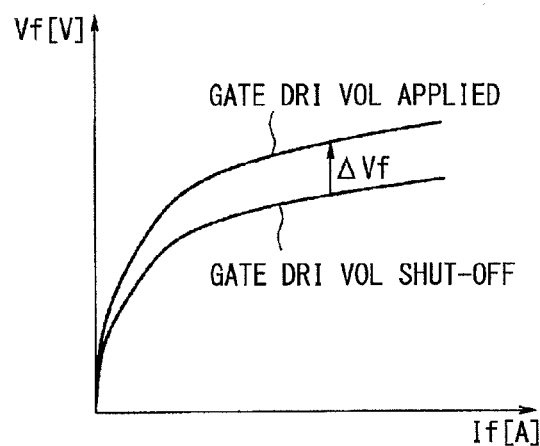
FIG. 4 is a graph showing a voltage-current relationship of a diode device in a forward direction.

Next, the function of the drive control apparatus 31B on the low side will be explained mainly with reference to FIGS. 4 to 12. The function of the drive control apparatus 31A on the high side is similar to the low side. In the RC-IGBT as the semiconductor device 1A, 1B, when the gate drive voltage is applied under a condition that the current flows through the diode 6, a channel is formed in the first region 12 so that an injection of holes is restricted. Accordingly, as shown in FIG. 4, the forward voltage Vf of the diode 6, through which the forward current If flows, increases by an increment Vf. Thus, the conduction loss of the diode 6, which is calculated by multiplying the forward voltage with the forward current (i.e., Vf×If), increases.

Figure 5:
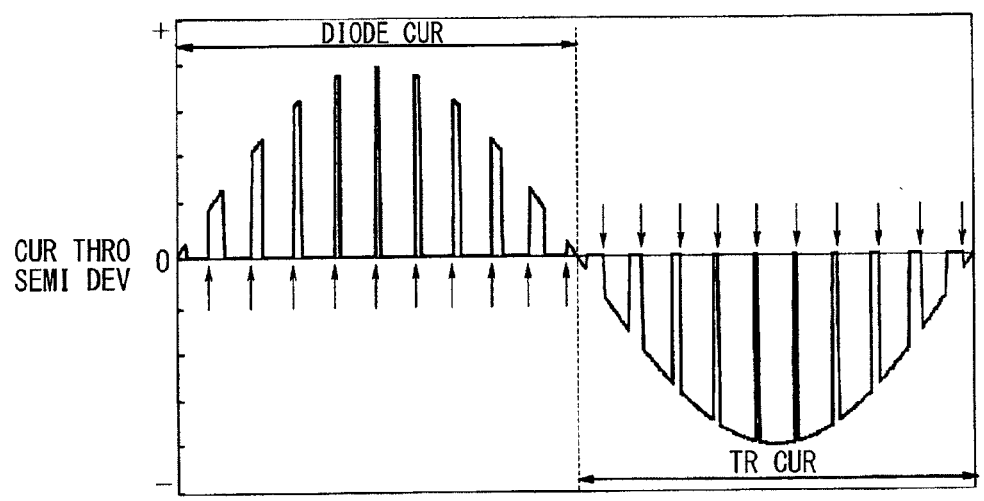
FIG. 5 is a graph showing a current waveform of the semiconductor device for providing a half bridge circuit.

When the drive ICs 24A, 24B drives the half bridge circuit 4 according to the PWM signals FH, FL, the current flowing through the semiconductor device 1B shows a waveform in FIG. 5. The current directed to the positive direction in FIG. 5 shows the current flowing through the diode 6 in a direction from the emitter electrode 15 to the collector electrode 18. The current directed to the negative direction in FIG. 5 shows the current flowing through the transistor 5 in a direction from the collector electrode 18 to the emitter electrode 15.

Specifically, in a first half period, the current flows from the output terminal Nt to the load. When the PWM signal F1 is in the high level, a load current (e.g., a phase current in an inverter apparatus) flows back via the diode 6 of the semiconductor device 1B. In a second half period, the current flows in a direction from the load to the output terminal Nt. When the PWM signal F1 is in the high level, the current flows via the transistor 5 of the semiconductor device 1B.

Figure 7:
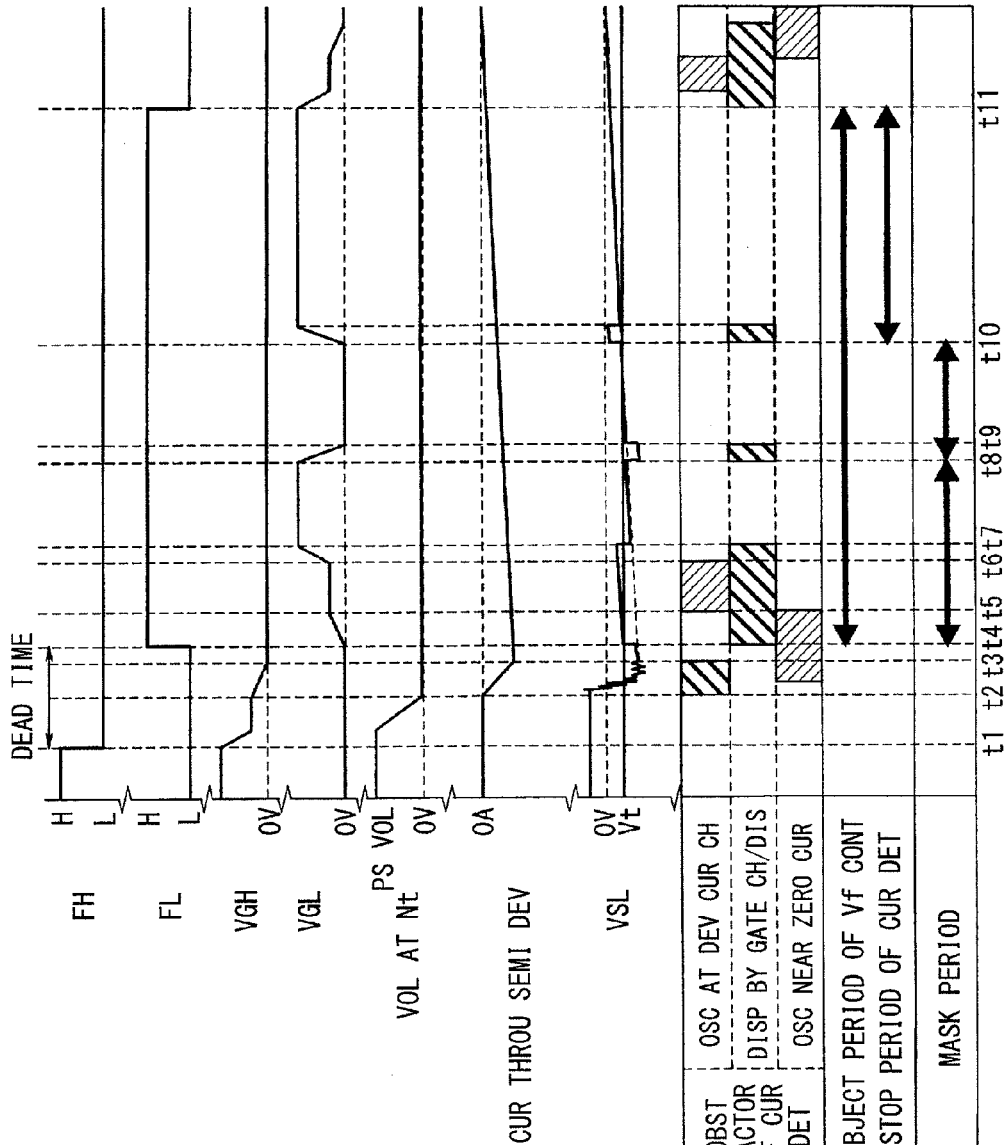
FIG. 7 is a diagram showing a fluctuating factor of a waveform and a sense voltage and a period of a Vf control.

In the Vf control of the semiconductor device 16 for reducing the conduction loss by reducing the forward voltage Vf of the diode 6, it is necessary to determine whether the current flows through the diode 6 when the PWM signal FL becomes the high level (i.e., at certain time shown as an arrow in FIG. 5). Further, in some cases, the current of the diode 6 may become null near the zero cross point, at which the direction of the phase current switches, during the high level period of the PWM signal FL, as shown in FIG. 7. Accordingly, when the Vf control is performed, it is preferable to always determine whether the current flows through the diode 6 during the high level period of the PWM signal FL.

Figure 6:
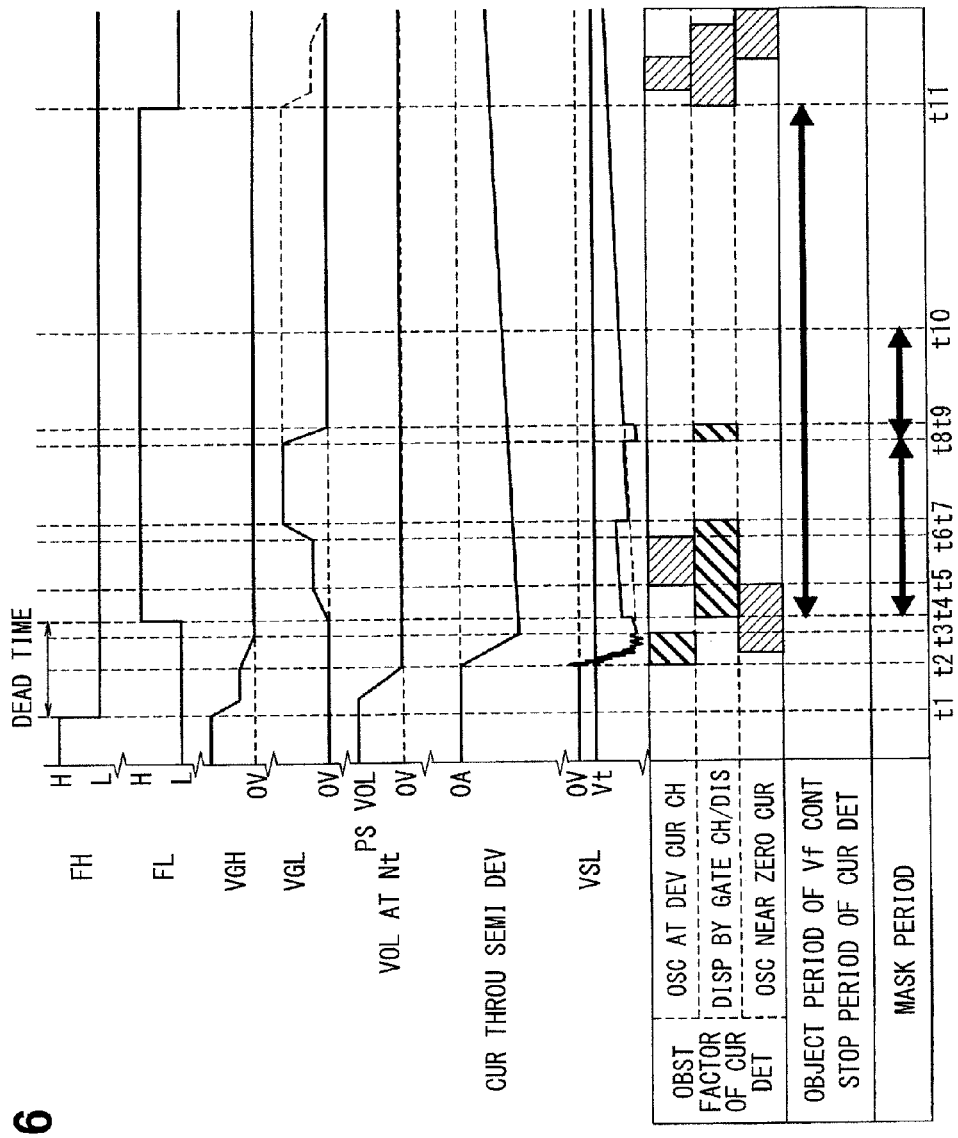
FIG. 6 is a diagram showing a fluctuating factor of a waveform and a sense voltage and a period of a Vf control.
Figure 8:
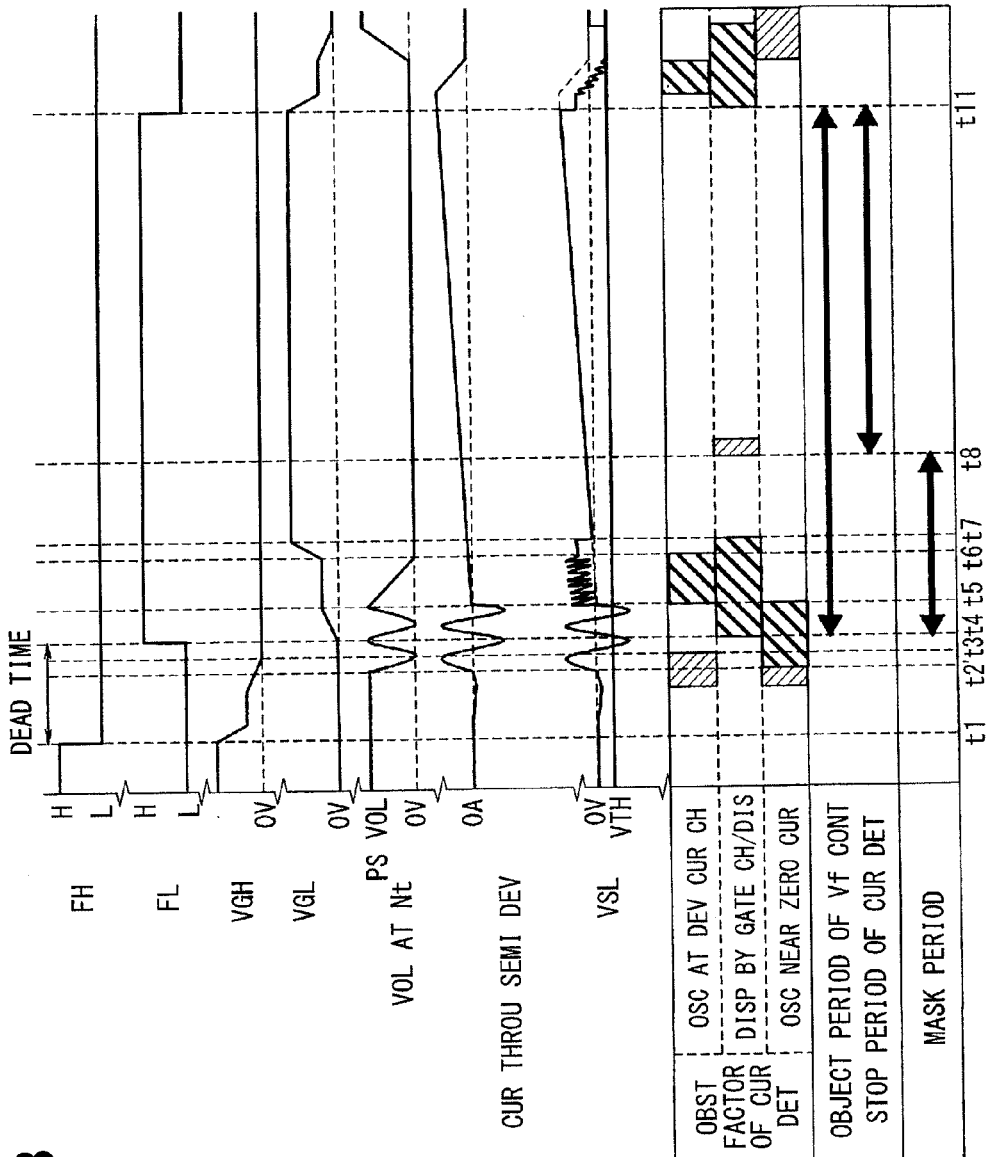
FIG. 8 is a diagram showing a fluctuating factor of a waveform and a sense voltage and a period of a Vf control.

In an actual circuit, in some cases, the current flowing through the diode 6 may be not detected accurately. FIGS. 6 to 8 show the PWM signals FH, FL, the gate drive voltages VGH, VGL, the voltage at the output terminal Nt, the current flowing through the semiconductor device 1B, the sense voltage VSL, the generation period of an obstructive factor of the current detection, the object period of the Vf control, the stop period of the current determination and the mask period during the high level period of the PWM signal FL, the previous period and the next period of the high level period.

The time t1 to t11 in FIGS. 6 to 8 corresponds to each other. In the obstructive factor of the current detection in each of FIGS. 6 to 8, the obstructive factor generated by the waveform state in an own drawing is shown as a thick line hatching region, and the obstructive factor generated by the waveform state in other drawings is shown as a thin line hatching region. FIG. 9 shows a current path flowing through the semiconductor device 1A, 1B at each time shown in FIG. 6. The voltage of the gate is shown in FIG. 9 under a condition that the gate drive voltages VGH, VGL are set to 15 volts, and the gate threshold voltage is defined as VTH.

FIG. 6 shows a case where the current equal to or more than the threshold current flows in the semiconductor device 1A, 1B. FIG. 7 shows a case where the current of the diode 6 falls below the threshold value at a middle point of the high level period of the PWM signal FL. FIG. 8 shows a case where the current of the semiconductor device 1A, 1B becomes zero during the dead time so that the current oscillates. A transient variation such as oscillation and displacement, which provide an obstruction of the current detection, is generated in the sense voltage VSL in each of FIGS. 6 to 9.

Figure 10A:
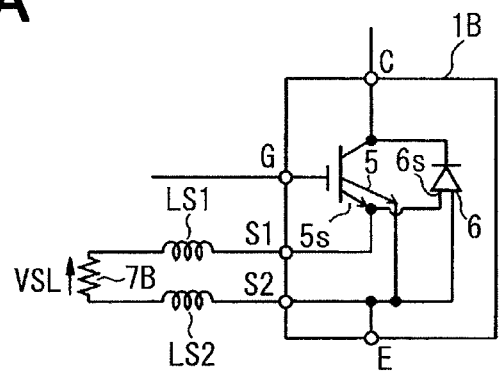
FIGS. 10A to 10C are diagrams explaining a first factor of fluctuation of the sense voltage transitionally.
Figure 10B:
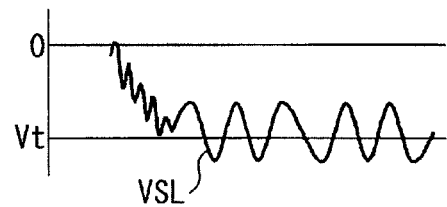
Figure 10C:
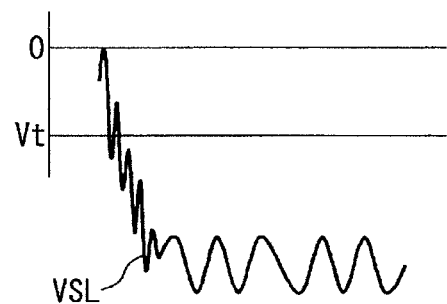
Figure 11:
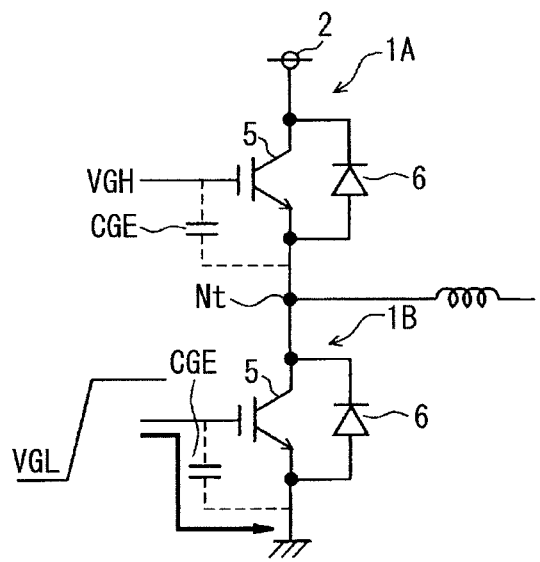
FIG. 11 is a diagram explaining a second factor fluctuation of the sense voltage transitionally.
Figure 12:
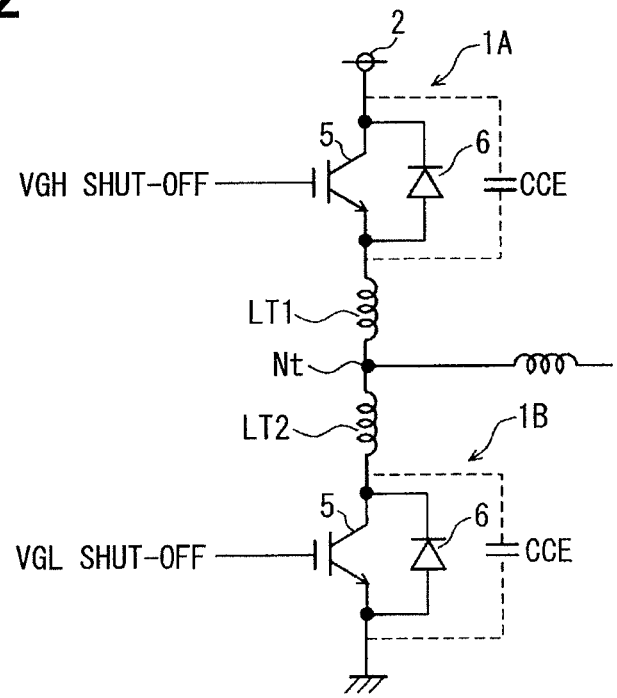
FIG. 12 is a diagram explaining a third factor of fluctuation of the sense voltage transitionally.

The transient variation of the sense voltage VSL may be generated by mainly three factors. The first factor is an oscillation caused by the parasitic inductance LS1, LS2 in the wiring from the sense terminal S1, S2 to the sense resistor 78 in the semiconductor device 16, as shown in FIG. 10A. The oscillation is generated ion the sense voltage VSL when the gate drive voltage VGL is applied or shut off so that the current flowing through the semiconductor device 13 is changed. Here, the actual current flowing through the semiconductor device 1B is not oscillated largely. FIG. 10B shows a case where the device current is small. FIG. 10C shows a case where the device current is large. When the device current is small, the determination whether the current flows through the diode 6 may be failed.

The second factor is a displacement caused by the capacitance CGE between the gate and the emitter of the semiconductor device 1B. The displacement is generated when the gate drive voltage VGL is applied or shut off, and the gate charge current or gate discharge current flows through the sense resistor 78 via the capacitance CGE between the gate and the emitter. Here, the actual current flowing through the semiconductor device 13 is not oscillated largely.

The third factor is an oscillation caused by a combination of the capacitance CCE between the collector and the emitter of the semiconductor device 1A, 1B and the parasitic inductance LT1, LT2 in the wiring of the semiconductor device 1A, 1B. The oscillation is generated as resonance caused by the capacitance CCE between the collector and the emitter and the parasitic inductance LT1, LT2 when the phase current becomes zero during the dead time under a condition that the phase current is nearly zero. In this case, different from the first and second factors, the actual current flowing through the semiconductor device 1A, 1B is oscillated.

In a case where the phase current equal to or larger than the threshold current flows, as shown in FIG. 6, the oscillation caused by the third factor is not generated. Further, when the phase current falls below the threshold current and does not become zero, as shown in FIG. 7, the oscillation caused by the third factor is not generated. In these cases, when the PWM signal FH becomes the low level at time t1, the drove IC 24A shuts off the gate drive voltage VGH using the drive circuit 28. The current flows through the transistor 5 of the semiconductor device 1A until time t2, at which the mirror period is expired, as shown in FIG. 9A.

The current of the semiconductor device 1A is reduced from time t2, at which the mirror period ends, and, instead, the current of the semiconductor device 1B increases. The current of the semiconductor device 1B is a back-flow current flowing through the diode 6. From time t2 to time t3, as shown in FIG. 9B, the current flows through both of the transistor 5 of the semiconductor device 1A and the diode 6 of the semiconductor device 1B. During this current change period, the sense voltage VSL is oscillated by the first factor.

The PWM signal FL on the low side becomes the high level at time t4, at which the dead time is expired. Then, the control circuit 27 of the drive IC 24B applies the gate drive voltage VGL using the drive circuit 28, which has the normal gate drive performance. The gate drive voltage VGL is applied unconditionally without determining the current in the diode 6 so as to avoid the oscillation generated at time t4 and caused by the third factor when the phase current is nearly zero, as shown in FIG. 8.

In the rising period of the gate drive voltage VGL from time t4 to time t7, the gate charging current flows. Thus, the sense voltage VSL is displaced to the positive direction according to the second factor. In a period from time t3 to time t5, as shown in FIG. 9C, the current of the semiconductor device 1A on the high side is shut off, and the current flows through only the semiconductor device 1B on the low side. During this period, since the gate drive voltage VGL is not sufficiently applied, the forward voltage Vf of the diode 6 is in a low state.

On the other hand, when the load current is nearly zero, the waveform is shown in FIG. 8. During the dead time, when the current becomes zero at time t2' which is later than time t2, the current flowing through the semiconductor device 1A, 1B is oscillated by the third factor. This oscillation continues until the PWM signal FL on the low side becomes the high level at time t4 and the gate drive voltage VGL is switched to the mirror period at time t5. During the mirror period from time t5 to time t6, since the current increases, the sense voltage VSL is oscillated by the first factor. Further, in the rising period of the gate drive voltage VGL from time t4 to time t7, since the gate charging current flows, the sense voltage VSL is displaced to the positive direction by the second factor.

The Vf control with respect to the semiconductor device 1B is directed to the high level period of the PWM signal FL. Accordingly, the control circuit 27 of the drive IC 24B stops executing the Vf control in a period other than the high level period (i.e., a period until time t4 and a period after time t11), so that the IC 24B applies and shuts off the gate drive voltage VGL according to the PWM signal FL.

The control circuit 27 of the drive IC 24B controls the drive circuit 28 to apply the gate drive voltage VGL at time t4, at which the PWM signal FL becomes the high level. Further, the control circuit 27 inputs the mask signal having the high level to the mask circuit 26 from time t4. The control circuit 27 maintains the mask signal to be the high level during the mask period (i.e., from time t4 to time t8) so that the control circuit 27 stops referring to the comparison signal SCL in order to avoid the determination error of the diode current caused by the transient variation such as an oscillation and a displacement generated in the sense voltage VSL. The mask period is preliminarily determined so as to include at least the period (i.e., from time t4 to time t7), in which the transient variation is generated. The mask period is stored or prepared in the control circuit 27. The period from time t7 to time t8 represents a allowance period.

The control circuit 27 refers to the comparison signal SCL at time t8 when the mask period is expired. The control circuit 27 determines that the current flows through the diode 6 when the control circuit 27 obtains a comparison result such that the sense voltage VSL is equal to or larger than the threshold voltage Vt in the forward direction of the diode 6. In this case, the control circuit 27 shuts off the gate drive voltage VGL using the drive circuit 29 having the high gate drive performance, as shown in FIGS. 6 and 7. In this case, since the current does not flow in the transistor 5, there is no influence on the device current even when the gate drive voltage VGL is shut off. When the control circuit 27 obtains a comparison result such that the sense voltage VSL is smaller than the threshold voltage Vt, the control circuit 27 determines that the current does not flow through the diode 6, and therefore, the control circuit 27 continues to apply the gate drive voltage VGL, as shown in FIG. 8.

In FIGS. 6 and 7, in the falling period of the gate drive voltage VGL from time t8 to time t9, the gate discharging current flows, so that the sense voltage VSL is displaced to the negative direction by the second factor. Thus, the control circuit 27 maintains the mask signal to be the high level since the control circuit 27 instructs the drive circuit 29 to shut off the gate drive voltage VGL until the mask period is expired (i.e., from time t8 to time t10), so that the control circuit 27 stops referring to the comparison signal SCL. In this case, the mask period is predetermined to be a total length of the period (from time t8 to time t9), in which the transient variation is generated, and the allowance period.

In a period from time t5 to time t9 in FIGS. 6 and 7, the gate drive voltage VGL is applied under a condition that the current flows through the diode 6, as shown in FIG. 9D. Thus, the forward voltage Vf increases by the increment ΔVf, so that the conduction loss increases, as shown in FIG. 4. On the other hand, in a period from time t9 to time t11 in FIG. 6, the gate drive voltage VGL is shut off under a condition that the current flows through the diode 6, as shown in FIG. 9E. Thus, the forward voltage Vf is reduced by the increment ΔVf, so that the conduction loss is reduced.

In a case in FIG. 7, the phase current is reduced, and the phase current falls below the threshold current at time t10.

When the control circuit 27 obtains the comparison result such that the sense voltage VSL is smaller than the threshold voltage Vt, the control circuit 27 determines that the current does not flow through the diode 6, and then, the control circuit 27 applies the gate drive voltage VGL using the drive circuit 39 having the high gate drive performance.

After that, the control circuit 27 continues to apply the gate drive voltage VGL till time t11, at which the PWM signal FL becomes the low level. In a case in FIG. 8, when the control circuit 27 obtains the comparison result such that the sense voltage VSL is smaller than the threshold voltage Vt, the control circuit 27 continues to apply the gate drive voltage VGL till time t11, at which the PWM signal FL becomes the low level.

Specifically, the control circuit 27 stops determining whether the current flows through the diode 6, and the control circuit 27 continues to apply the gate drive voltage VGL unconditionally after the control circuit 27 obtains the comparison result such that the sense voltage VSL is smaller than the threshold voltage Vt in a period that the PWM signal FL is the high level. FIGS. 6 to 8 show this period as the stop period of the current determination. During the stop period of the current determination, it is not necessary to set the mask period.

The control circuit 27 stops the current determination because of the stabilization when the sense voltage VSL falls below the threshold voltage Vt, as shown in FIG. 7. In this case, even if the mask period is set by the application of the gate drive voltage VGL, the shut-off and the application of the gate drive voltage VGL may be repeated by the slight variation overlapped on the sense voltage VSL.

When the PWM signal Fl becomes the low level at t11, the control circuit 27 huts off the gate drive voltage VGL using the drive circuit 28. After that, when the dead time is expired, the PWM signal FH becomes the high level. During the period in which the PWM signal FH is the high level, the Vf control is performed on the semiconductor device 1A.

Thus, the control circuit 27 of the drive IC 24A, 24B determines that the current flows through the diode 6 of the semiconductor device 1A, 1B having the RC-IGBT structure in the high level period of the PWM signal FH, FL, the control circuit 27 shuts off the gate drive voltage VGH, VGL. According to the Vf control, the forward voltage Vf of the diode 6 is reduced, so that the conduction loss of the diode 6 is reduced.

Since the sense voltage VSH, VSL detected by the sense resistor 7A, 7B includes a transient variation such as an oscillation and a displacement, the transient variation provides the obstruction for determining accurately whether the current flows through the diode 6. The control circuit 27 refers to the comparison result between the sense voltage VSH, VSL and the threshold voltage Vt so as to avoid the period, in which the transient variation may be generated. Thus, the control circuit 27 can avoid the influence of the transient variation without increasing the threshold voltage Vt. When the threshold voltage Vt is set to be low, the width of the dead zone, in which the control circuit 27 mistakenly determines that the current does not flow through the diode 6 although the current actually flows through the diode 6, is narrowed. Thus, the current determination result is obtained with high accuracy.

As a result, since the gate drive voltage VGH, VGL is surely shut off when the current flows through the diode 6 in a certain period other than the period, in which the transient variation is generated. Thus, the conduction loss of the diode 6 is surely reduced. Further, since the gate drive voltage VGH, VGL is surely applied in a period, in which the current does not flow through the diode 6, the half bridge circuit flows the current having a comparative small distortion in the load according to the PWM signal FH, FL.

The control circuit 27 preliminary prepares the mask period set to include the period, in which the transient variation is generated. The mask period starts at time as a starting point, at which the application and shut-off of the gate drive voltage VGH, VGL is instructed. Here, the starting point includes time, at which the PWM signal FH, FL changes to the high level. Thus, the start timing of the mask period and the comparison timing of the sense voltage VSH, VSL are easily controlled.

The control circuit 27 stops the current determination of the diode 6 after the circuit 27 obtains the comparison result such that the current detection signal is smaller than the current threshold, so that the circuit 27 continues to apply the gate drive voltage VGH, VGL. Thus, the generation of the oscillation between the shut-off and the application of the gate drive voltage VGH, VGL is restricted.

The control circuit 27 utilizes the drive circuit 28 having the normal gate drive performance in order to restrict the voltage surge caused by the rapid current change when the circuit 27 shuts off the gate drive voltage UGH, VGL according to an event such that the PWM signal FH, FL is changed to the low level. On the other hand, the control circuit 27 utilizes the drive circuit 29 having the high gate drive performance since the rapid current change is not generated when the circuit 27 shuts off the gate drive voltage VGH, VGL according to the current determination result in the Vf control. Thus, the shut-off period of the gate drive voltage VGH, VGL in a case where the current flows through the diode 6 is secured to be long, so that the conduction loss is much reduced.

The control circuit 27 may set the mask period to be shorter as the gate drive performance for charging and discharging the gate capacity of the semiconductor device 1A, 1B is high. Since the time for changing the gate drive voltage VGH, VGL is short when the gate drive performance is high, the overlapping period of the transient variation generated in the sense voltage VSH, VSL become short. For example, when the gate drive voltage VGH is applied or shut off using the drive circuit 29 shown in FIG. 1, the mask period may be set to shorter than a case where the gate drive voltage VGH is applied or shut off using the drive circuit 28. When the mask period is short, the shut-off period of the gate drive voltage VGH, VGL in a case where in the current flows through the diode 6 is secured to be long. Thus, the conduction loss is much reduced.

In the above embodiment, the sense resistor 7A, 7B is formed as the current detection device in the semiconductor device 1A, 1B by forming the sense device in the semiconductor device 1A, 1B. Alternatively, the shunt resistor may be formed in series with the semiconductor device 1A, 1B. Alternatively, a hole sensor may be formed in the semiconductor device 1A, 1B. The current detection device may detect at least the current flowing through the diode 6.

The RC-IGBT may be a trench gate type device or a planar gate type device. The semiconductor device 1A, 16 may include a MOS transistor and a parasitic diode in the MOS transistor. The MOS transistor may be a trench gate type device, a planar gate type device or a SJ type device.

The above disclosure has the following aspects.

According to an aspect of the present disclosure, a drive control apparatus for a semiconductor device having an insulated gate type transistor structure and a diode structure, which are disposed in a same semiconductor substrate, wherein the semiconductor device includes an energization electrode of the transistor structure and an energization electrode of the diode structure, which are provided by a common electrode, and wherein a gate drive voltage is applied to the insulated gate type transistor structure, the drive control apparatus includes: a current detection device for outputting at least a current detection signal, which corresponds to a current flowing through the diode structure; and a control device. The control device applies the gate drive voltage to the semiconductor device when an on-instruction signal is input in the control device. The control device compares the current detection signal with a current threshold value preliminary set in a forward direction of the diode structure during a first period, in which the on-instruction signal is input in the control device, after a second period has elapsed from first time, at which the control device applies the gate drive voltage, or second time, at which the control device shuts off the gate drive voltage. A transient variation caused by a change of a gate drive state is generated on the current detection signal in the second period. The control device shuts off the gate drive voltage when the current detection signal is equal to or larger than the current threshold value. The control device applies the gate drive voltage when the current detection signal is smaller than the current threshold value.

The above drive control apparatus refers to a comparison result between the current detection signal and the current threshold value so as to avoid a period, in which a transient variation such as an oscillation and a displacement may be overlapped on the current detection signal. Thus, the apparatus determines accurately without increasing the current threshold value whether the current flows through the diode structure. Thus, the gate drive voltage is surely shut off in the period, in which the current flows through the diode structure, other than the period, in which the transient variation may be overlapped on the current detection signal. Accordingly, a conduction loss of the diode structure is reduced. Further, the gate drive voltage is surely applied in a period, in which the current does not flow through the diode structure. Accordingly, the apparatus flows the current through the transistor structure according to the on-instruction signal.

Alternatively, the control device may set a mask period, which includes the second period. The control device compares the current detection signal with the current threshold value during the first period after the mask period has elapsed from the first time or the second time. The control device starts the mask period from time, at which the control device instructs to apply and shut off, the gate drive voltage. Thus, the start timing of the mask period and the comparison timing of the current detection signal are easily controlled.

Alternatively, the control device may set the mask period to be shorter as a gate drive performance for charging and discharging a gate capacity of the semiconductor device becomes higher. As higher the gate drive performance, shorter time for the gate drive voltage change. Thus, the overlapping period of the transient variation generated on the current detection signal becomes shorter. When the mask period is reduced, the shut-off period of the gate drive voltage in a case where the current flows through the diode structure is secure to be longer. Thus, the conduction loss is much reduced.

Alternatively, the control device may continue to apply the gate drive voltage during a third period after the control device obtains a comparison result that the current detection signal is smaller than the current threshold value. The third period is defined from third time, at which an on-instruction signal input starts, to fourth time, at which the on-instruction signal input ends. This type of situation arises when the current flows through the transistor structure or when the current flowing through the diode structure falls below the current threshold value. Specifically, when the current flowing through the diode structure falls below the current threshold value, the generation of an oscillation repeatedly switched between application and shut-off of the gate drive voltage is restricted.

Alternatively, the control device may set a gate drive performance, in a case where the control device shuts off the gate drive voltage when the current detection signal is equal to or larger than the current threshold value, to be higher than a case where the control device shuts off the gate drive voltage when an on-instruction signal input ends. In this case, the shut-off period of the gate drive voltage in a case where the current flows through the diode structure is secured to be longer. Thus, the conduction loss is much reduced.

Alternatively, the semiconductor device may be a plurality of switching devices for providing a half bridge circuit. The switching devices are connected in series with each other between a high voltage side and a low voltage side via an output terminal, which is sandwiched between the switching devices. In this case, in a case where an inductive load such as a motor is connected to the half bridge circuit, when the gate drive voltage is shut off under a condition that the current flows through the transistor structure, the current flows back to the diode structure of another semiconductor device. Accordingly, the conduction loss of the diode structure becomes small, and a distortion at a polarity reverse time of the current becomes small.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A drive control apparatus for a semiconductor device having an insulated gate type transistor structure and a diode structure, which are disposed in a same semiconductor substrate, wherein the semiconductor device includes an energization electrode of the transistor structure and an energization electrode of the diode structure, which are provided by a common electrode, and wherein a gate drive voltage is applied to the insulated gate type transistor structure, the drive control apparatus comprising:
   a current detection device for outputting at least a current detection signal, which corresponds to a current flowing through the diode structure; and
   a control device, wherein:
   the control device applies the gate drive voltage to the semiconductor device when an on-instruction signal is input in the control device;
   the control device compares the current detection signal with a current threshold value preliminary set in a forward direction of the diode structure during a first period, in which the on-instruction signal is input in the control device, after a second period has elapsed from first time, at which the control device applies the gate drive voltage, or second time, at which the control device shuts off the gate drive voltage;
   a transient variation caused by a change of a gate drive state is generated on the current detection signal in the second period;
   the control device shuts off the gate drive voltage when the current detection signal is equal to or larger than the current threshold value; and the control device applies the gate drive voltage when the current detection signal is smaller than the current threshold value.

2. The drive control apparatus according to claim 1, wherein:
   the control device sets a mask period, which includes the second period; and
   the control device compares the current detection signal with the current threshold value during the first period after the mask period has elapsed from the first time or the second time.

3. The drive control apparatus according to claim 2, wherein:
   the control device sets the mask period to be shorter as a gate drive performance for charging and discharging a gate capacity of the semiconductor device becomes higher.

4. The drive control apparatus according to claim 1, wherein:
   the control device continues to apply the gate drive voltage during a third period after the control device obtains a comparison result that the current detection signal is smaller than the current threshold value; and
   the third period is defined from third time, at which an on-instruction signal input starts, to fourth time, at which the on-instruction signal input ends.

5. The drive control apparatus according to claim 1, wherein:
   the control device sets a gate drive performance, in a case where the control device shuts off the gate drive voltage when the current detection signal is equal to or larger than the current threshold value, to be higher than a case where the control device shuts off the gate drive voltage when an on-instruction signal input ends.

6. The drive control apparatus according to claim 1, wherein:
   the semiconductor device is a plurality of switching devices for providing a half bridge circuit; and
   the switching devices are connected in series with each other between a high voltage side and a low voltage side via an output terminal, which is sandwiched between the switching devices.

* * * * *